United States Patent
Radovanov et al.

(10) Patent No.: US 7,339,179 B2
(45) Date of Patent: Mar. 4, 2008

(54) TECHNIQUE FOR PROVIDING A SEGMENTED ELECTROSTATIC LENS IN AN ION IMPLANTER

(75) Inventors: Svetlana B. Radovanov, Marblehead, MA (US); Anthony Renau, West Newbury, MA (US); James Steve Buff, Brookline, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 68 days.

(21) Appl. No.: 11/413,570

(22) Filed: Apr. 28, 2006

(65) Prior Publication Data

US 2007/0164229 A1     Jul. 19, 2007

Related U.S. Application Data

(60) Provisional application No. 60/736,293, filed on Nov. 15, 2005.

(51) Int. Cl.
    *H01J 37/10* (2006.01)
(52) U.S. Cl. .............................. 250/396 R; 250/492.2; 250/492.1
(58) Field of Classification Search ............. 250/492.2, 250/492.21, 396 R, 492.1
    See application file for complete search history.

(56) References Cited

U.S. PATENT DOCUMENTS

| | | | |
|---|---|---|---|
| 4,870,284 A | 9/1989 | Hashimoto et al. | |
| 5,091,655 A | 2/1992 | Dykstra et al. | |
| 5,160,846 A * | 11/1992 | Ray | 250/492.2 |
| 5,177,366 A | 1/1993 | King et al. | |
| 5,748,360 A | 5/1998 | Chikyou et al. | |
| 5,780,863 A * | 7/1998 | Benveniste et al. | 250/492.21 |
| 5,932,882 A | 8/1999 | England et al. | |
| 5,969,366 A | 10/1999 | England et al. | |
| 6,040,582 A | 3/2000 | Kim | |
| 6,060,715 A * | 5/2000 | England et al. | 250/492.21 |
| 6,326,631 B1 | 12/2001 | Politiek et al. | |
| 6,777,696 B1 | 8/2004 | Rathmell et al. | |
| 6,838,677 B2 | 1/2005 | Keller | |
| 6,998,625 B1 * | 2/2006 | McKenna et al. | 250/492.21 |
| 2005/0151089 A1 * | 7/2005 | Bong et al. | 250/396 R |

FOREIGN PATENT DOCUMENTS

WO     WO92/01306 A     1/1992

* cited by examiner

*Primary Examiner*—Jack I. Berman
*Assistant Examiner*—Michael J Logie (57) ABSTRACT

A technique for providing a segmented electrostatic lens in an ion implanter is disclosed. In one particular exemplary embodiment, the technique may be realized as an electrostatic lens for use in an ion implanter. The lens may comprise an entrance electrode biased at a first voltage potential, wherein an ion beam enters the electrostatic lens through the entrance electrode. The lens may also comprise an exit electrode biased at a second voltage potential, wherein the ion beam exits the electrostatic lens through the exit electrode. The lens may further comprise a suppression electrode located between the entrance electrode and the exit electrode, the suppression electrode comprising a plurality of segments that are independently biased to manipulate an energy and a shape of the ion beam.

19 Claims, 8 Drawing Sheets

TECHNIQUE FOR PROVIDING A SEGMENTED ELECTROSTATIC LENS IN AN ION IMPLANTER

CROSS-REFERENCE TO RELATED APPLICATIONS

This patent application claims priority to U.S. Provisional Patent Application No. 60/736,293, filed Nov. 15, 2005, which is hereby incorporated by reference herein in its entirety.

FIELD OF THE DISCLOSURE

The present disclosure relates generally to ion implantation and, more particularly, to a technique for providing a segmented electrostatic lens in an ion implanter.

BACKGROUND OF THE DISCLOSURE

Ion implanters are widely used in semiconductor manufacturing to selectively alter conductivity of materials. In a typical ion implanter, ions generated from an ion source are directed through a series of beam-line components which include one or more analyzing magnets and a plurality of electrodes. The analyzing magnets select desired ion species, filter out contaminant species and ions having incorrect energies, also adjusting ion beam quality at a target wafer. Suitably shaped electrodes can be used to modify the energy and the shape of the ion beam.

Figure 1:
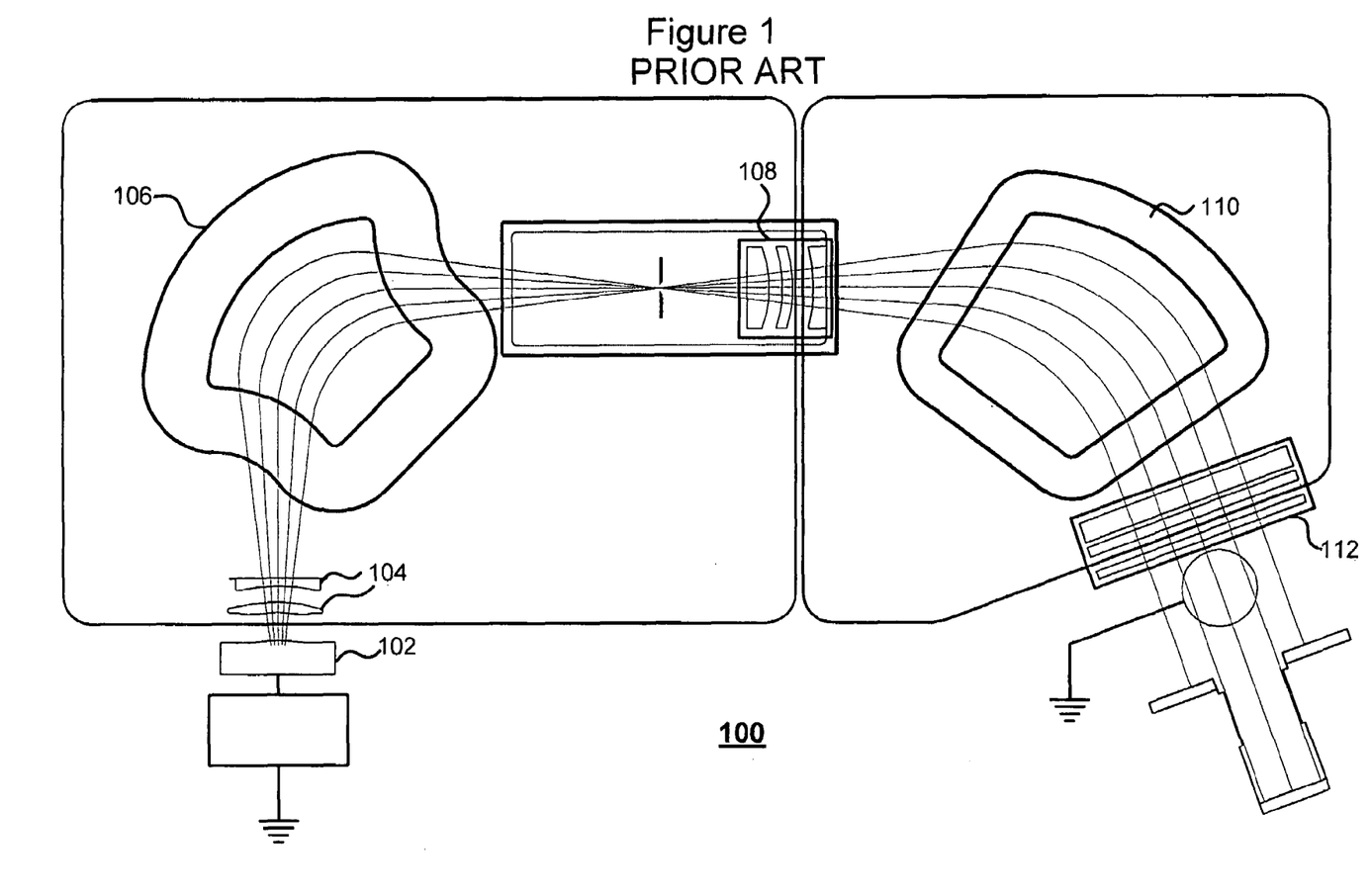
FIG. 1 shows a conventional ion implanter.

FIG. 1 shows a known ion implanter 100 which comprises an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy.

Figure 2:
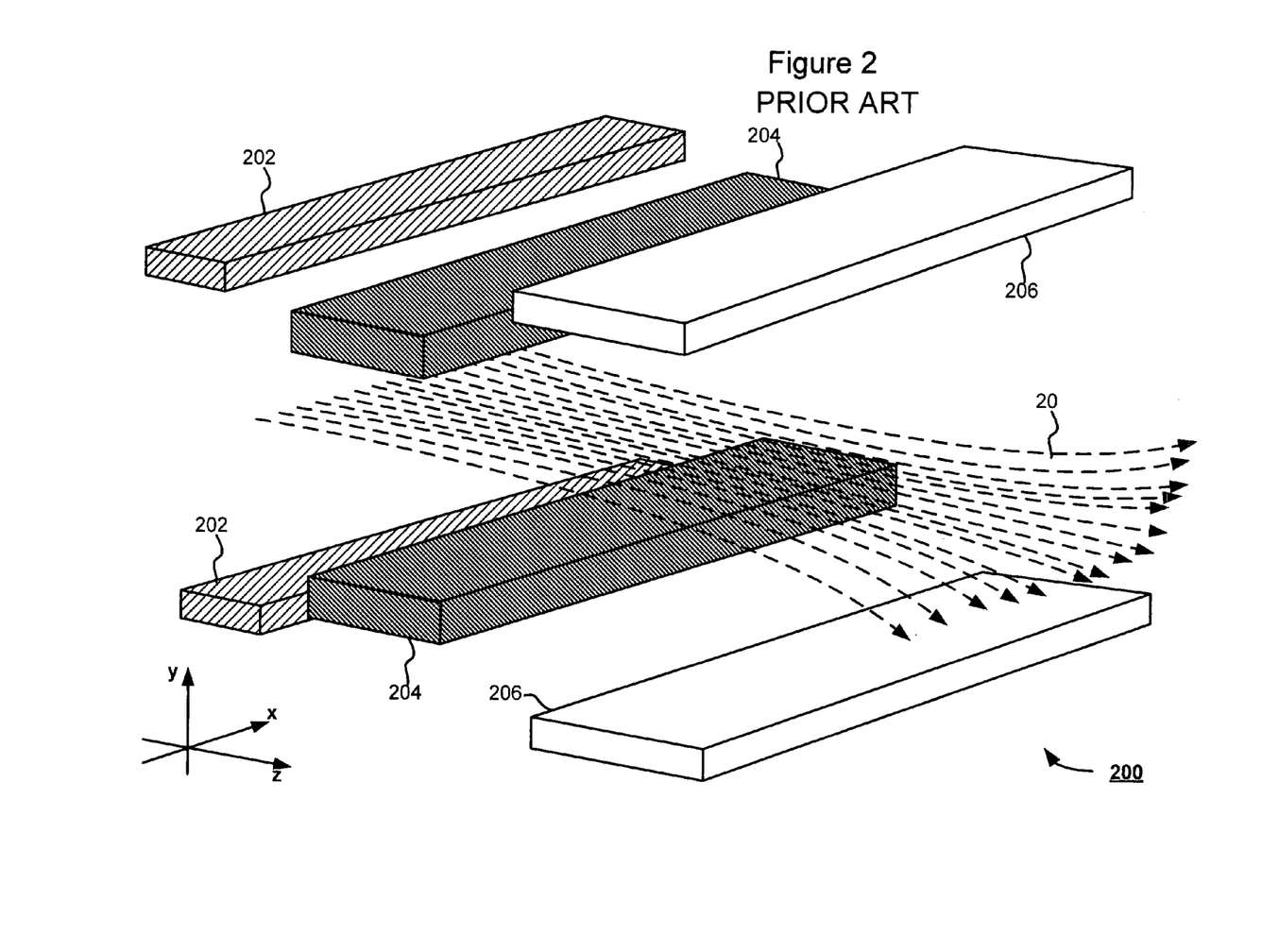
FIGS. 2 and 3 show a conventional electrostatic triode lens and illustrate a problem therein.

The above-mentioned D1 or D2 deceleration lenses are typically electrostatic triode (or tetrode) deceleration lenses. FIG. 2 shows a perspective view of a conventional electrostatic triode deceleration lens 200. The electrostatic triode deceleration lens 200 comprises three sets of electrodes: entrance electrodes 202 (also referred to as "terminal electrodes"), suppression electrodes 204 (or "focusing electrodes"), and exit electrodes 206 (also referred to as "ground electrodes" though not necessarily connected to earth ground). A conventional electrostatic tetrode deceleration lens is similar to the electrostatic triode deceleration lens 200, except that a tetrode lens has an additional set of suppression electrodes (or focusing electrodes) between the suppression electrodes 204 and the exit electrodes 206.

In the electrostatic triode deceleration lens 200, each set of electrodes may have a space to allow an ion beam 20 to pass therethrough (e.g., in the +z direction along the beam direction). As shown in FIG. 2, each set of electrodes may include two conductive pieces electrically coupled to each other to share a same voltage potential. Alternatively, each set of electrodes may be a one-piece structure with an aperture for the ion beam 20 to pass therethrough. As such, each set of electrodes are effectively a single electrode having a single voltage potential. For simplicity, each set of electrodes are referred to in singular. That is, the entrance electrodes 202 are referred to as an "entrance electrode 202," the suppression electrodes 204 are referred to as a "suppression electrode 204," and the exit electrodes 206 are referred to as an "exit electrode 206."

In operation, the entrance electrode 202, the suppression electrode 204, and the exit electrode 206 are independently biased such that the energy of the ion beam 20 is manipulated in the following fashion. The ion beam 20 may enter the electrostatic triode deceleration lens 200 through the entrance electrode 202 and may have an initial energy of, for example, 10-20 keV. Ions in the ion beam 20 may be accelerated between the entrance electrode 202 and the suppression electrode 204. Upon reaching the suppression electrode 204, the ion beam 20 may have an energy of, for example, approximately 30 keV or higher. Between the suppression electrode 204 and the exit electrode 206, the ions in the ion beam 20 may be decelerated, typically to an energy that is closer to the one used for ion implantation of a target wafer. Therefore, the ion beam 20 may have an energy of, for example, approximately 3-5 keV or lower when it exits the electrostatic triode deceleration lens 200.

Figure 3:
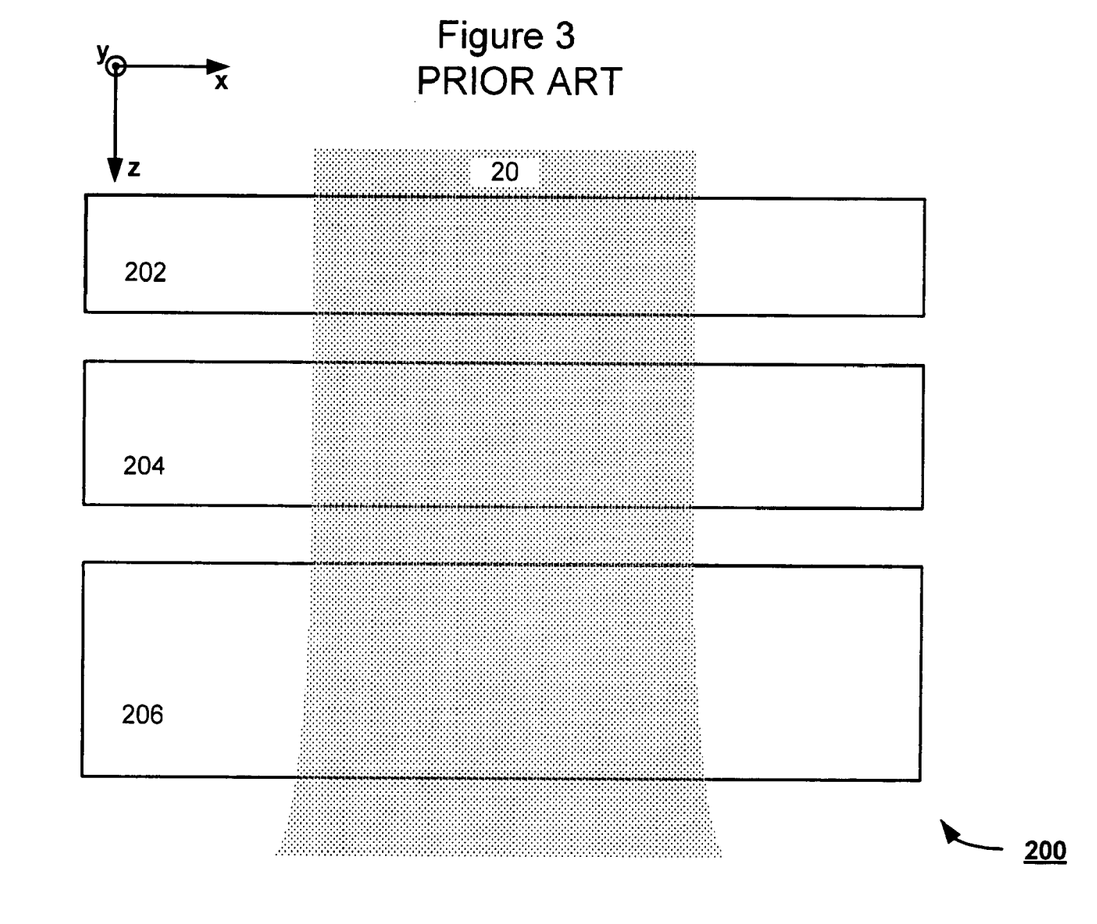

The significant changes in ion energies that take place in the electrostatic triode deceleration lens 200 can have a substantial impact on a shape of the ion beam 20. FIG. 3 shows a top view of the electrostatic triode deceleration lens 200. As is well known, space charge effects are more significant in low-energy ion beams than in high-energy ion beams. Therefore, as the ion beam 20 is accelerated between the entrance electrode 202 and the suppression electrode 204, little change is observed in the shape of the ion beam 20. However, when the ion energy is drastically reduced between the suppression electrode 204 and the exit electrode 206, the ion beam 20 tends to expand in both X and Y dimensions at its edges. As a result, a considerable number of ions may be lost before they reach the target wafer, and the effective dose of the ion beam 20 is reduced.

There have been attempts to reduce the above-described space charge effect in an electrostatic triode lens. In one approach, for example, Pierce geometry, well known to those skilled in the art, is introduced to each electrode in the electrostatic triode deceleration lens. That is, each electrode is bent at its tip to a defined angle such that electric fields inside the electrostatic triode lens are such that they generate focusing forces counteracting the space charge spreading effects at the edge of an ion beam. However, this approach can only achieve a limited success in controlling ion beam shapes. Despite a changed shape, each electrode still remains one conductive piece biased with a single voltage potential. As a result, generation of the focusing forces at the edge of the ion beam is constrained by the overall voltage potential applied to the electrode. In addition, one particular shape of an electrode may be useful for adjustment of only one particular beam shape or the purveyance of the ion beam.

In view of the foregoing, it would be desirable to provide a technique for providing an electrostatic lens which overcomes the above-described inadequacies and shortcomings.

SUMMARY OF THE DISCLOSURE

A technique for providing a segmented electrostatic lens in an ion implanter is disclosed. In one particular exemplary embodiment, the technique may be realized as an electrostatic lens for use in an ion implanter. The lens may comprise an entrance electrode biased at a first voltage potential, wherein an ion beam enters the electrostatic lens through the entrance electrode. The lens may also comprise an exit electrode biased at a second voltage potential, wherein the ion beam exits the electrostatic lens through the exit electrode. The lens may further comprise a suppression electrode located between the entrance electrode and the exit electrode, the suppression electrode comprising a plurality of segments that are independently biased to manipulate an energy and a shape of the ion beam.

In accordance with other aspects of this particular exemplary embodiment, a first set of electrostatic fields may be created between the suppression electrode and the entrance electrode, the first set of electrostatic fields accelerating the ion beam to a first electrical potential. A second set of electrostatic fields may be created between the suppression electrode and the exit electrode, the second set of electrostatic fields decelerating the ion beam to a second electrical potential. According to one embodiment, the entrance electrode, the exit electrode, and the suppression electrode may be configured and biased to provide a first (or a second) stage of deceleration for a ribbon-shaped ion beam in the ion implanter.

In accordance with further aspects of this particular exemplary embodiment, the plurality of segments may comprise at least one center electrode and at least two side electrodes. The at least one center electrode may be biased to manipulate the energy of the ion beam, and the at least two side electrodes may be biased independently from the at least one center electrode to correct a divergence of the ion beam. The at least two side electrodes may be biased to offset a space-charge effect near edges of the ion beam. The at least two side electrodes may be disposed symmetrically with respect to the at least one center electrode. The at least two side electrodes may also be symmetrically biased.

In accordance with additional aspects of this particular exemplary embodiment, the plurality of segments may comprise at least one center electrode and two or more end electrodes that shield out external electrostatic fields.

In accordance with a further aspect of this particular exemplary embodiment, the ion beam may be a ribbon-shaped ion beam, and the electrostatic lens may be adapted to accommodate the ribbon-shaped ion beam.

In accordance with a yet further aspect of this particular exemplary embodiment, at least one electrode in the electrostatic lens may have a curved edge that further alters electric fields inside the electrostatic lens.

In accordance with a still further aspect of this particular exemplary embodiment, the suppression electrode may comprise one center electrode and two side electrodes that are disposed symmetrically on each side of the center electrode. Alternatively, the suppression electrode may comprise one center electrode and two side electrodes that are disposed asymmetrically on each side of the center electrode.

The electrostatic lens may further comprise an additional suppression electrode between the suppression electrode and the exit electrode.

In another particular exemplary embodiment, the technique may be realized as a method for providing an electrostatic lens for use in an ion implanter. The method may comprise providing an entrance electrode biased at a first voltage potential. The method may also comprise providing an exit electrode and biased at a second voltage potential. The method may further comprise providing a suppression electrode located between the entrance electrode and the exit electrode, the suppression electrode comprising a plurality of segments. The method may additionally comprise independently biasing the plurality of segments in the suppression electrode to create electric fields that manipulate an energy and a shape of an ion beam that enters the electrostatic lens through the entrance electrode and exits the electrostatic lens through the exit electrode.

In accordance with other aspects of this particular exemplary embodiment, the electric fields may manipulate an angular shape of an envelope of the ion beam.

In accordance with further aspects of this particular exemplary embodiment, the plurality of segments may comprise at least one center electrode and at least two side electrodes. The at least one center electrode may be biased to manipulate the energy of the ion beam, and the at least two side electrodes may be biased independently from the at least one center electrode to correct a divergence of the ion beam. The method may further comprise biasing the at least two side electrodes to offset a space-charge effect near edges of the ion beam. The method may also comprise positioning and biasing the at least two side electrodes symmetrically with respect to the at least one center electrode.

In accordance with additional aspects of this particular exemplary embodiment, the method may further comprise providing an additional suppression electrode between the suppression electrode and the exit electrode.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure illustrate an improved type of electrostatic lens that has one or more segmented suppression electrodes. These electrodes may comprise multiple segments that are independently or separately biased with respect to one another thereby providing flexible and effective manipulation of an ion beam's shape as well as its energy.

Figure 4:
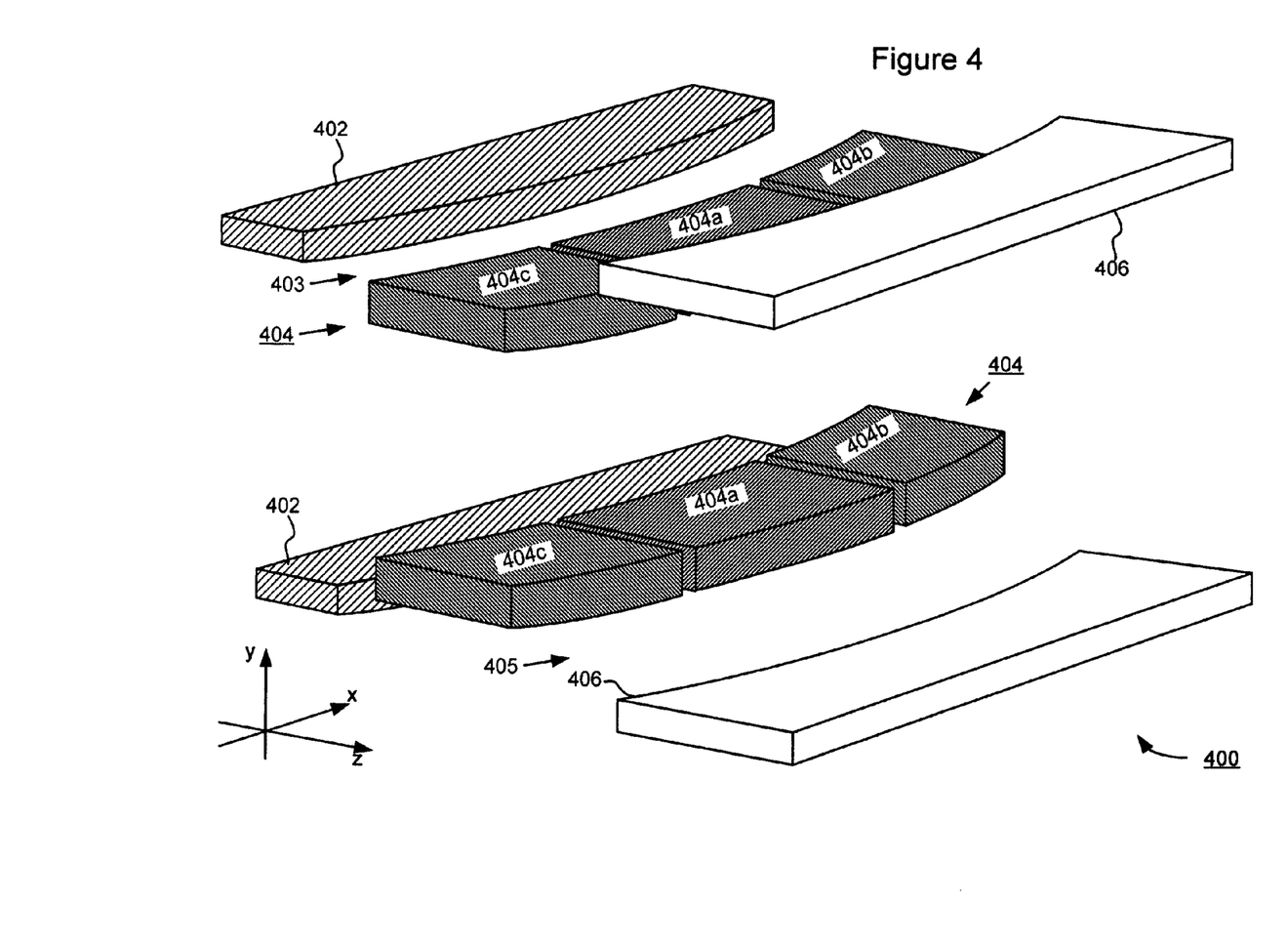
FIG. 4 shows a perspective view of an electrostatic triode lens in accordance with an embodiment of the present disclosure.

Referring to FIG. 4, there is shown a perspective view of an electrostatic lens 400 in accordance with an embodiment of the present disclosure. Somewhat similar to a conventional electrostatic triode lens, the electrostatic lens 400 may comprise an entrance electrode 402 and an exit electrode 406. Instead of a single suppression electrode, however, the electrostatic lens 400 may comprise a plurality of electrodes (collectively referred to as "suppression electrode 404") between the entrance electrode 402 and the exit electrode 406. In other words, what used to be a single suppression electrode may be segmented into multiple electrodes (or segments) that may be independently positioned and biased to create desired electric fields in the electrostatic lens 400. In the exemplary electrostatic lens 400, the suppression electrode 404 is segmented into or comprises three electrodes: a center electrode 404a, and two side electrodes 404b and 404c. The side electrodes 404b and 404c may be symmetrically positioned with respect to the center electrode 404a. Depending on a shape of an incoming ion beam and a desired shape change, gap 403 between the entrance electrode 402 and the suppression electrode 404 may have a contour with defined curvature(s). Similarly, gap 405 between the suppression electrode 404 and the exit electrode 406 may also have a contour with defined curvature(s).

Figure 5:
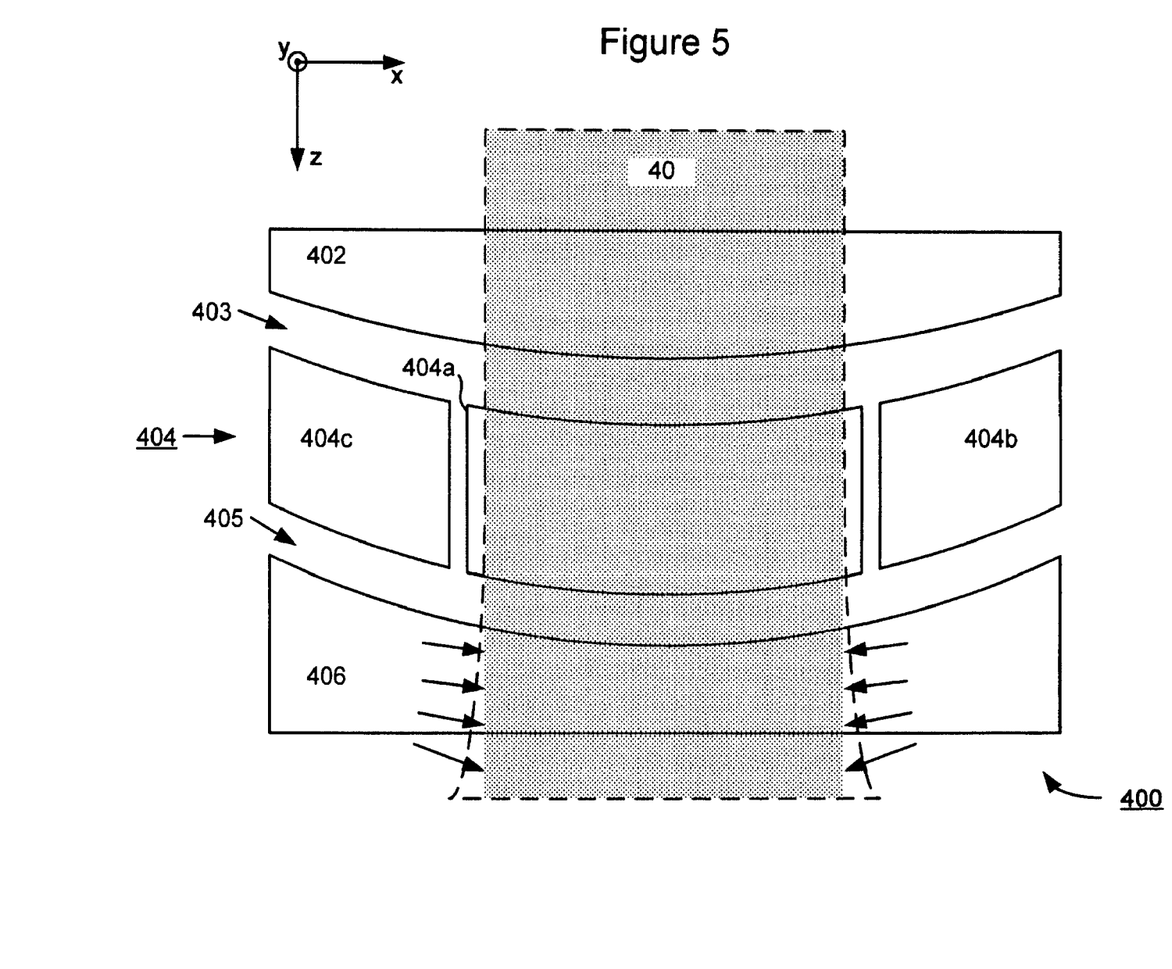
FIG. 5 shows a top view of an electrostatic lens in accordance with an embodiment of the present disclosure.

FIG. 5 shows a top view of the electrostatic lens 400 in accordance with an embodiment of the present disclosure. An ion beam 40 may enter the electrostatic lens 400 through the entrance electrode 402. The ion beam 40 may be a ribbon-shaped ion beam that is wider in an x-direction than its height in a y-direction. The ion beam 40 may have an initial energy of, for example, approximately 10-20 keV. Assuming the ion beam 40 mainly consists of positive ions, the entrance electrode 402 may be biased at a same or similar potential as the incoming ion beam 40, and the center electrode 404a of the segmented suppression electrode 404 may be biased at a much lower potential than the entrance electrode 402. For example, according to one embodiment, the entrance electrode 402 may be biased at 22 kV and the center electrode 404a may be biased at −11 kV. As a result, a strong electric field may be created to accelerate the positive ions as they travel from the entrance electrode 402 towards the suppression electrode 404. The exit electrode 406 may be biased at a potential that is the same as or similar to a potential of a target wafer which receives the ion beam 40. In this embodiment, for example, the exit electrode 406 may be biased at ground potential, which decelerates the ions 40 to an energy of approximately 3-5 keV or lower. In another embodiment, the entrance electrode 402 may be biased at −12 kV, the center electrode 404a of the segmented suppression electrode 404 may be biased at −2 kV, and the exit electrode 406 may be biased at ground potential. As a result, an ion beam 40 with an initial energy of approximately 15 keV may be decelerated to approximately 3 keV upon exiting the deceleration lens 400. In addition, the side electrodes 404b and 404c may be positioned and/or biased independently from the center electrode 404a to provide a desired correction to a shape of the ion beam 40. Depending on the specific usage in an ion implanter (e.g., either as D1 or as D2 deceleration lens shown in FIG. 1), the electrostatic lens 400 may be configured to, for example, adjust a divergence angle of the ion beam 40, or change a width of the ion beam 40, or do both. The side electrodes 404b and 404c may be positioned and biased accordingly. In this embodiment, a main purpose of the electrostatic lens 400 is to reduce the divergence angle for the ion beam 40. Therefore, the side electrodes 404b and 404c are disposed in the same plane as the center electrode 404a and are positioned symmetrically with respect to the center electrode 404a. Both the side electrodes 404b and 404c are biased at −8.5 kV, which creates focusing forces along edges of the ion beam 40 to compensate for a defocusing effect of space charges. As a result, the ion beam 40 may have a small divergence or none at all after being decelerated between the suppression electrode 404 and the exit electrode 406. In addition, curvatures of the electrodes may further tailor electric fields (e.g., in the gaps 403 and 405) to produce focusing or defocusing forces as desired.

It should be noted that, for illustration purposes, the upper and lower pieces in each electrode of the electrostatic lens 400 are treated as sharing a same shape and bias. However, this is only necessary when an ion beam is symmetric or non-diverging in the y-direction. It is contemplated that the electrostatic lens technique described herein may be applied in the y-direction as well as in the x-direction. In addition, either or both suppression electrodes in an electrostatic tetrode lens may be segmented as described herein.

Figure 6:
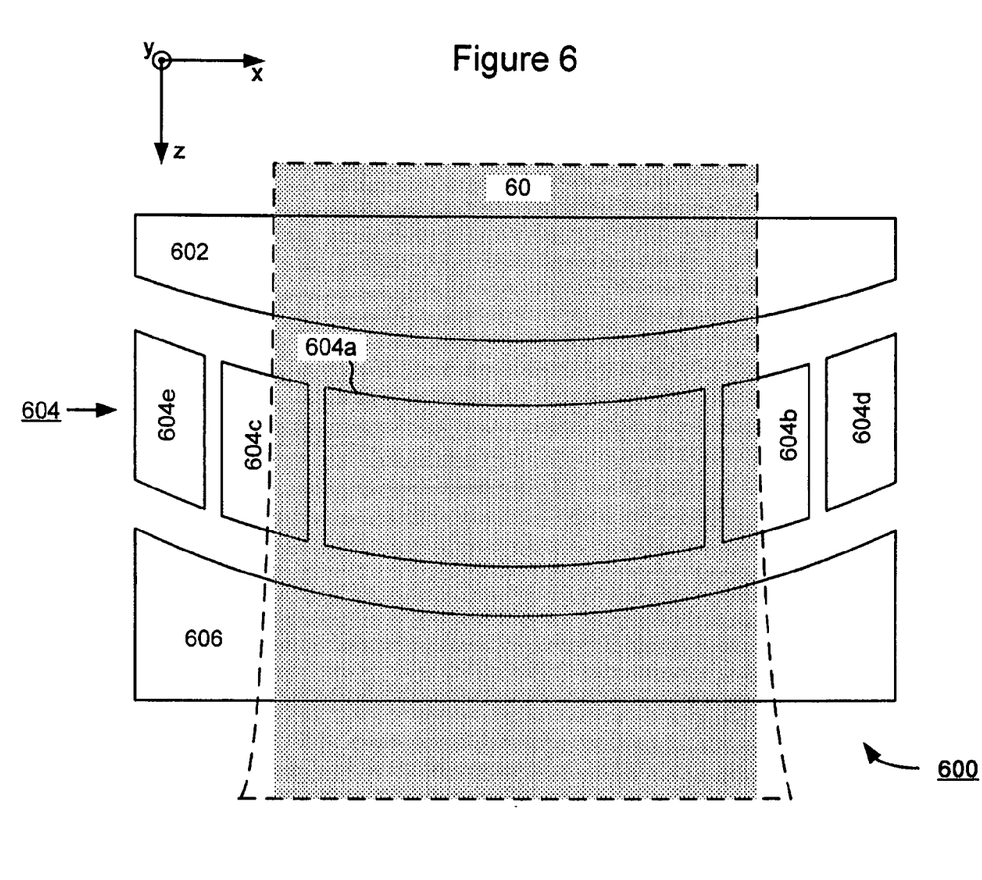
FIG. 6 shows a top view of another electrostatic lens in accordance with an embodiment of the present disclosure.

FIG. 6 shows a top view of an electrostatic lens 600 in accordance with an embodiment of the present disclosure. The electrostatic lens 600 may comprise an entrance electrode 602, a suppression electrode 604, and an exit electrode 606. Here, the suppression electrode 604 may comprise five segments: a center electrode 604a, and four side electrodes 604b, 604c, 604d, and 604e. The side electrodes may be in a same plane as the center electrode 604a. The side electrodes 604b and 604c may be positioned symmetrically with respect to the center electrode 604a. Similarly, the side electrodes 604d and 604e may be positioned symmetrically with respect to the center electrode 604a. The center electrode 604a may be biased with respect to the entrance electrode 602 to accelerate an incoming ion beam 60, and with respect to the exit electrode 606 to decelerate the ion beam 60. According to one embodiment, the side electrodes 604b and 604c may share a first voltage potential that is independent from the voltage potential on the center electrode 604a. Similarly, the side electrodes 604d and 604e may share a second voltage potential that is independent from the first voltage potential or the voltage potential on the center electrode 604a.

In both the 3-segment configuration, as shown in FIGS. 4 and 5, and the 5-segment configuration as shown in FIG. 6, actual voltage potentials applied to the independently biased electrodes may be either computationally determined based on mathematical models, or experimentally determined based on iterative adjustment of biasing voltages and measurement of angle response function(s). Alternatively, the computational and experimental methods may be combined in determining the biasing voltages. According to one embodiment, it may be desirable to keep the number of segments in the suppression electrode down in order to save computation time or tuning time.

Figure 7:
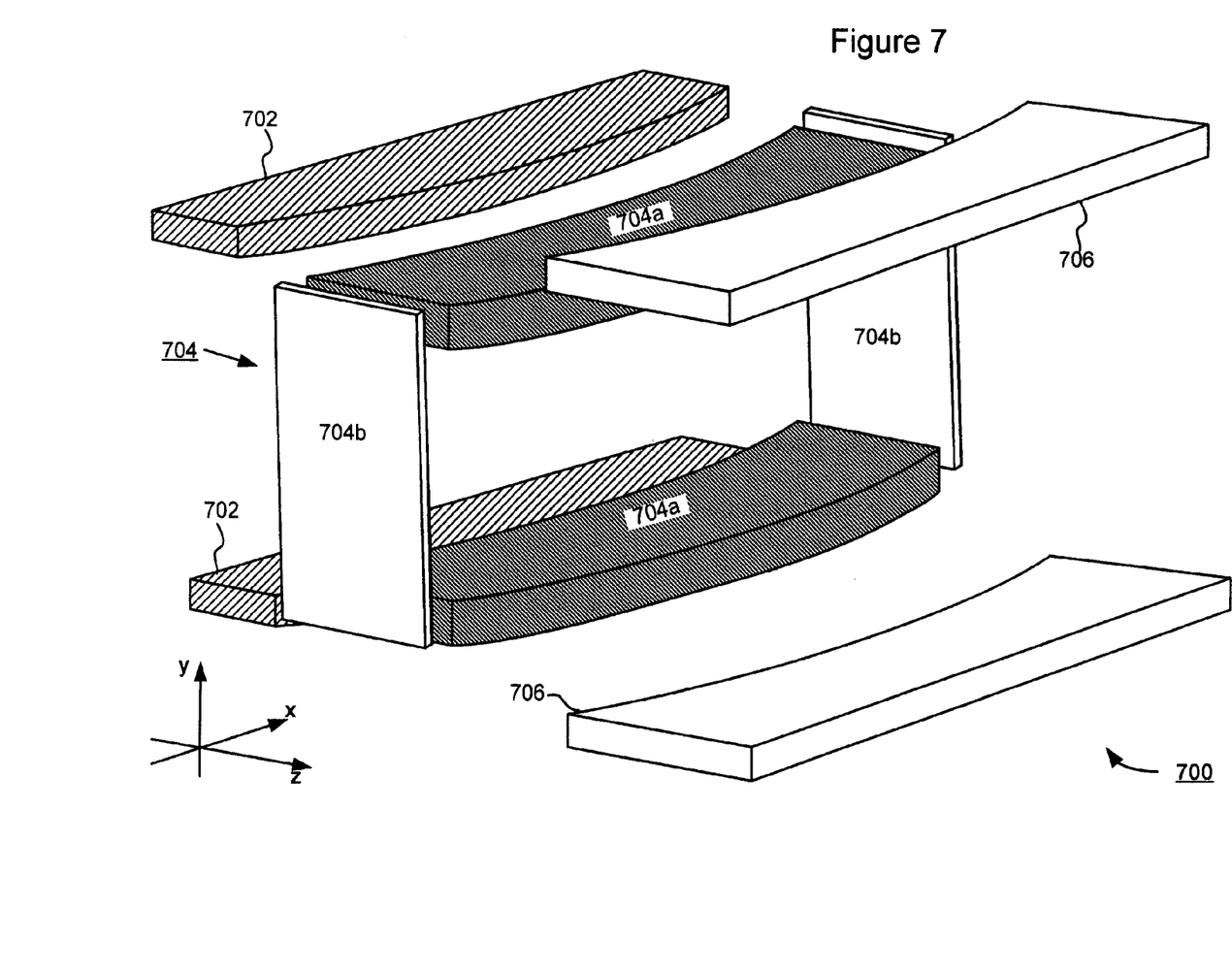
FIG. 7 shows a perspective view of yet another electrostatic lens in accordance with an embodiment of the present disclosure.

FIG. 7 shows a perspective view of an electrostatic lens 700 in accordance with an embodiment of the present disclosure. The electrostatic lens 700 may comprise an entrance electrode 702, a suppression electrode 704, and an exit electrode 706. The suppression electrode 704 may comprise center electrodes 704a and end electrodes 704b. The center electrodes 704a may be biased at a first voltage potential while the end electrodes 704b may be biased at a second voltage potential. According to one embodiment, this configuration may be used in a D2 deceleration lens such as the one shown in FIG. 1. At the D2 deceleration lens, an ion beam may be wider and taller than when it is at the D1 deceleration lens. It may be desirable to adjust both the width and divergence angle of the ion beam. The properly biased end electrodes 704*b* may provide the focusing forces needed to reduce the width and divergence angle of the ion beam. In addition, the end electrodes 704*b* may shield out unwanted electromagnetic interferences.

Figure 8:
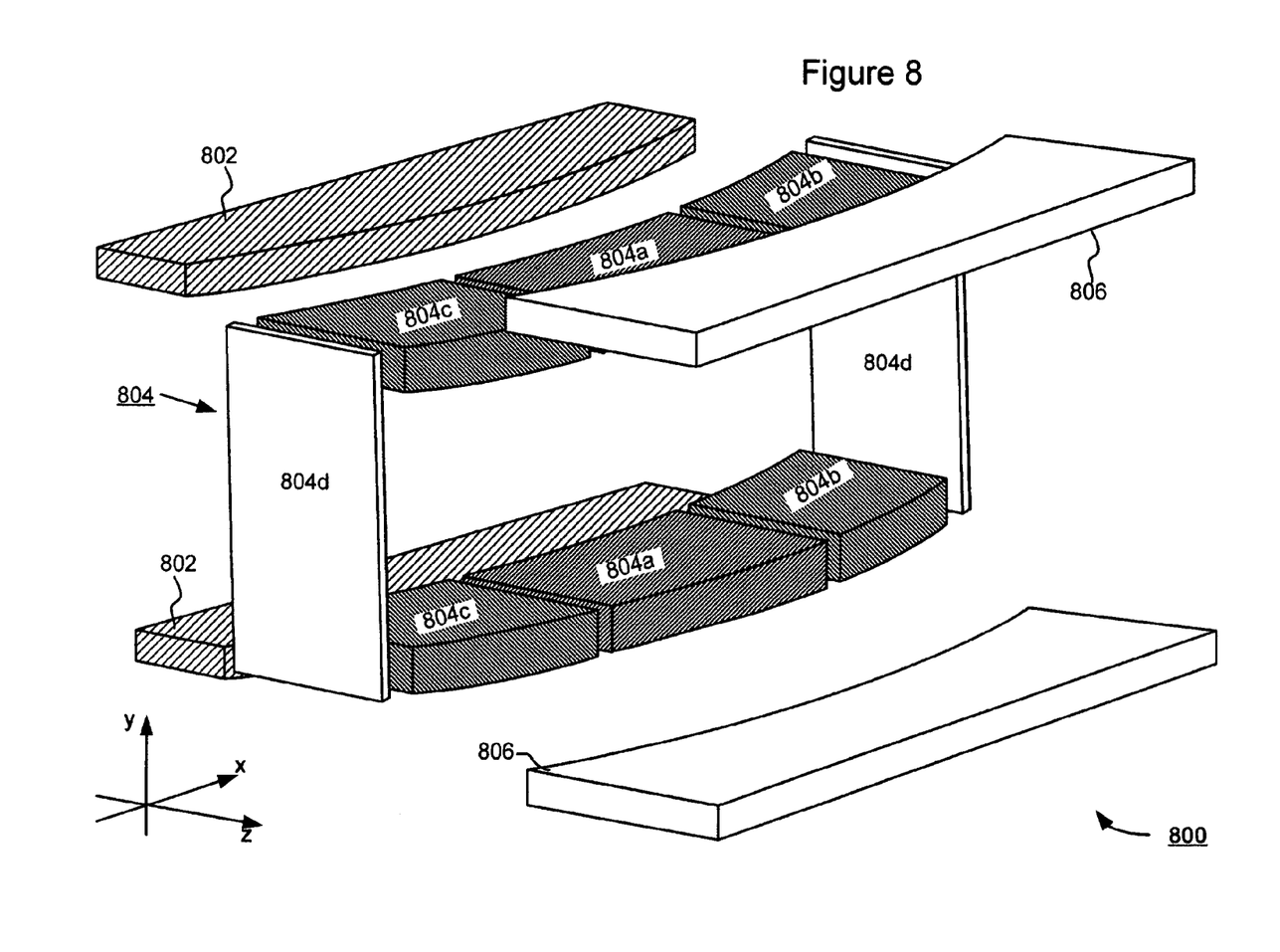
FIG. 8 shows a perspective view of still another electrostatic lens in accordance with an embodiment of the present disclosure.

FIG. 8 shows a perspective view of an electrostatic lens 800 in accordance with an embodiment of the present disclosure. The electrostatic lens 800 may comprise an entrance electrode 802, a suppression electrode 804, and an exit electrode 806. The suppression electrode 804 may comprise center electrodes 804*a*, side electrodes 804*b* and 804*c*, and end electrodes 804*d*. Compared with the electrostatic lens 700, the electrostatic lens 800 have the additional side electrodes 804*b* and 804*c* and therefore may provide more capability to shape electric fields. On the other hand, the additional side electrodes 804*b* and 804*c* may also mean additional variables to deal with.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An electrostatic lens for use in an ion implanter, the lens comprising:
   an entrance electrode biased at a first voltage potential, wherein an ion beam enters the electrostatic lens through the entrance electrode;
   an exit electrode biased at a second voltage potential, wherein the ion beam exits the electrostatic lens through the exit electrode; and
   a suppression electrode located between the entrance electrode and the exit electrode, the suppression electrode comprising an upper portion and a lower portion, the upper and lower portions being disposed such that ion beam is transmitted between the upper and lower portions, wherein at least one of the upper and lower portion comprises a plurality of segments that are independently biased to manipulate an energy and a shape of the ion beam.

2. The electrostatic lens according to claim 1, wherein:
   a first set of electrostatic fields are created between the suppression electrode and the entrance electrode, the first set of electrostatic fields accelerating the ion beam to a first electrical potential; and
   a second set of electrostatic fields are created between the suppression electrode and the exit electrode, the second set of electrostatic fields decelerating the ion beam to a second electrical potential.

3. The electrostatic lens according to claim 1, wherein the plurality of segments comprise at least one center electrode and at least two side electrodes, wherein the at least one center electrode is biased to manipulate the energy of the ion beam, and wherein the at least two side electrodes are biased independently from the at least one center electrode to correct a divergence of the ion beam.

4. The electrostatic lens according to claim 3, wherein the at least two side electrodes are biased to offset a space-charge effect near edges of the ion beam.

5. The electrostatic lens according to claim 3, wherein the at least two side electrodes are disposed symmetrically with respect to the at least one center electrode.

6. The electrostatic lens according to claim 5, wherein the at least two side electrodes are both biased at a bias voltage level.

7. The electrostatic lens according to claim 1, wherein the suppression electrode further comprises:
   two or more end electrodes that shield out external electrostatic fields.

8. The electrostatic lens according to claim 1, wherein the ion beam is a ribbon-shaped ion beam, and wherein the electrostatic lens is adapted to accommodate the ribbon-shaped ion beam.

9. The electrostatic lens according to claim 1, wherein at least one of the entrance electrode, the exit electrode, or the suppression electrode has a curved edge that further alters electric fields inside the electrostatic lens.

10. The electrostatic lens according to claim 1, wherein the plurality of segments comprises one center electrode and two side electrodes that are disposed symmetrically on each side of the center electrode.

11. The electrostatic lens according to claim 1, further comprising an additional suppression electrode between the suppression electrode and the exit electrode.

12. The electrostatic lens according to claim 1, wherein the entrance electrode, the exit electrode, and the suppression electrode are configured and biased to provide a first stage of deceleration for a ribbon-shaped ion beam in the ion implanter.

13. The electrostatic lens according to claim 12, wherein the entrance electrode, the exit electrode, and the suppression electrode are configured and biased to provide a second stage of deceleration for a ribbon-shaped ion beam in the ion implanter, the second stage of deceleration positioned downstream from a first stage of deceleration in a direction of travel of the ribbon-shaped ion beam.

14. A method for providing an electrostatic lens for use in an ion implanter, the method comprising the steps of:
   providing an entrance electrode biased at a first voltage potential;
   providing an exit electrode and biased at a second voltage potential;
   providing a suppression electrode located between the entrance electrode and the exit electrode, the suppression electrode comprising an upper portion and a lower portion, the upper and lower portions being disposed such that ion beam is transmitted between the upper and lower portions, wherein at least one of the upper and lower portion comprises a plurality of segments; and
   independently biasing the plurality of segments in the suppression electrode to create electric fields that manipulate an energy and a shape of an ion beam that enters the electrostatic lens through the entrance electrode and exits the electrostatic lens through the exit electrode.

15. The method according to claim 14, wherein the electric fields manipulate an angular shape of an envelope of the ion beam.

16. The method according to claim 14, wherein the plurality of segments comprise at least one center electrode and at least two side electrodes, wherein the at least one center electrode is biased to manipulate the energy of the ion beam, and wherein the at least two side electrodes are biased independently from the at least one center electrode to correct a divergence of the ion beam.

17. The method according to claim 16, further comprising:
 biasing the at least two side electrodes to offset a space-charge effect near edges of the ion beam.

18. The method according to claim 16, further comprising:
 positioning and biasing the at least two side electrodes symmetrically with respect to the at least one center electrode.

19. The method according to claim 14, further comprising:
 providing an additional suppression electrode between the suppression electrode and the exit electrode.

\* \* \* \* \*